United States Patent
Kim

(12) 
(10) Patent No.: US 7,816,970 B2
(45) Date of Patent: Oct. 19, 2010

(54) LOW VOLTAGE MIXER WITH IMPROVED GAIN AND LINEARITY

(75) Inventor: Deok-Hwan Kim, Seoul (KR)

(73) Assignee: Samsung Electronics Co., Ltd, Swuon-si (KR)

( * ) Notice: Subject to any disclaimer, the term of this patent is extended or adjusted under 35 U.S.C. 154(b) by 0 days.

(21) Appl. No.: 12/431,078

(22) Filed: Apr. 28, 2009

(65) Prior Publication Data

US 2009/0278588 A1    Nov. 12, 2009

(30) Foreign Application Priority Data

May 6, 2008    (KR) .................... 10-2008-0041935

(51) Int. Cl.
    *G06G 7/12* (2006.01)
(52) U.S. Cl. .................. 327/359; 327/355; 455/326
(58) Field of Classification Search ......... 327/355–361; 455/326, 323
    See application file for complete search history.

(56) References Cited

U.S. PATENT DOCUMENTS

| | | | |
|---|---|---|---|
| 6,205,325 B1* | 3/2001 | Groe | 455/333 |
| 7,016,664 B2* | 3/2006 | Souetinov | 455/323 |
| 7,254,380 B2* | 8/2007 | Kuei-Ann et al. | 455/313 |
| 7,342,432 B2* | 3/2008 | Kim et al. | 327/359 |
| 7,356,317 B2* | 4/2008 | Xu et al. | 455/130 |
| 2005/0124311 A1* | 6/2005 | Mahmoudi et al. | 455/323 |

\* cited by examiner

*Primary Examiner*—Dinh T. Le
(74) *Attorney, Agent, or Firm*—Jefferson IP Law, LLP

(57) ABSTRACT

A frequency mixing apparatus with improved voltage gain and linearity is provided. The frequency mixing apparatus includes a transconductor, a separator, and a switching unit. A voltage gain of the transconductor is controllable, and the transconductor converts a Radio Frequency (RF) signal into a current signal under control of a self bias. The separator transfers the current signal to the switching unit. The switching unit outputs a signal having a frequency corresponding to one of a sum and a difference of a frequency of the RF signal and a frequency of a Local Oscillation (LO) signal by performing a switching operation according to the LO signal.

17 Claims, 4 Drawing Sheets

□ $I_{RF}$, CONVENTIONAL FREQUENCY MIXER
▲ $I_{RF}$, FREQUENCY MIXER ACCORDING TO EXEMPLARY EMBODIMENT

LOW VOLTAGE MIXER WITH IMPROVED GAIN AND LINEARITY

PRIORITY

This application claims the benefit under 35 U.S.C. §119 (a) of a Korean patent application filed in the Korean Intellectual Property Office on May 6, 2008 and assigned Serial No. 10-2008-0041935, the entire disclosure of which is hereby incorporated by reference.

BACKGROUND OF THE INVENTION

1. Field of the Invention

The present invention relates to a frequency mixing apparatus. More particularly, the present invention relates to a frequency mixing apparatus for improving a voltage gain and linearity by separating a bias of a transconductor unit and a bias of a switching unit of the frequency mixer.

2. Description of the Related Art

A frequency mixer directly converts a Radio Frequency (RF) signal into a baseband data signal, or converts the RF signal into an Intermediate Frequency (IF) signal, and is widely used in a wireless communication transceiver.

FIG. 1 illustrates a conventional single-balanced frequency mixer.

Referring to FIG. 1, the single-balanced frequency mixer includes a transconductor 140 including single transistor MN1 112, a switching unit 130 including transistor MN2 108 and MN3 110, and an output unit 150 including resistors $R_L$ 100 and 102. When an input RF signal is applied to a gate 114 of MN1 112, the transconductor 140 converts the RF signal into a current signal $I_{gm}$, and the converted current signal is input to common source node of transistors MN2 108 and MN3 110. At this point, Local Oscillation (LO) signals LO+ and LO−, via gate nodes 107 and 109, switch on/off transistors MN2 108 and MN3 110, so that a signal IF+ and IF− corresponding to a difference (intermediate frequency) between an RF frequency and an LO frequency is output via drains 104 and 106 of transistors MN2 108 and MN3 110. Generally, in a frequency mixer, when a current $I_{gm}$ flowing through a transistor of the transconductor unit 140 is increased, linearity improves. However, in a case of the single-balanced frequency mixer, when a current $I_{gm}$ is increased, currents flowing through the transistors MN2 108 and MN3 110 of the switching unit 130, and the resistors $R_L$ 100 and 102 of the output unit 150 also increase. When a current $I_{sw}$ flowing through the resistors $R_L$ 100 and 102 of the output unit 150 increases, a voltage drop over the resistor $R_L$ 100 or 102 increases, so that the range of fluctuation in an output voltage is reduced.

To address a limitation of the single-balanced frequency mixer, a frequency mixer which uses a current-bleeding technique has been proposed. The current-bleeding frequency mixer allows more current to flow through the transistor MN1 112 in the transconductor 140 and may reduce a current $I_{sw}$ flowing through the switching unit 130 and the load resistors $R_L$ 100 and 102 by using an additional current source. However, the additional current source operates as another noise source, and increases parasitic capacitance of a common source node of transistors MN2 108 and MN3 110 of the switching unit 130, so that a noise of the frequency mixer indirectly increases.

As described above, in the case of the single-balanced frequency mixer and the current-bleeding frequency mixer, bias currents of the transconductor units and the switching units are not independent. Instead, the bias currents of the transconductor units and the switching units are closely related to each other. Furthermore, since the sources of the transistors of the switching unit are connected to the drain of the transistor of the transconductor unit, it is difficult to optimize the biases of the transconductor unit and the switching unit. Generally, the linearity of the transconductor unit improves when a gate-source voltage and a drain-source voltage applied to the transistor of the transconductor unit are large. Therefore, the ability to improve the linearity of the transconductor according to a conventional frequency mixer structure is limited.

SUMMARY OF THE INVENTION

An aspect of the present invention is to address at least the above-mentioned problems and/or disadvantages and to provide at least the advantages described below. Accordingly, an aspect of the present invention is to provide a frequency mixing apparatus with improved gain and linearity.

In accordance with an aspect of the present invention, a low voltage frequency mixing apparatus with improved voltage gain and linearity is provided. The apparatus includes a transconductor whose voltage gain is controllable, for converting a Radio Frequency (RF) signal into a current signal under control of a self bias, a separator for transferring the current signal to a switching unit, and the switching unit for outputting a signal having a frequency corresponding to one of a sum and difference of a frequency of the RF signal and a frequency of a Local Oscillation (LO) signal by performing a switching operation according to the LO signal.

In accordance with another aspect of the present invention, a low voltage frequency mixing apparatus with improved voltage gain and linearity is provided. The apparatus includes a first transconductor for converting a positive RF (RF+) signal into a first current signal under control of a first self bias, and a second transconductor for converting a negative RF (RF−) signal into a second current signal under control of a second self bias, a first separator for transferring the first current signal to a switching unit, and a second separator for transferring the second current signal to the switching unit, and a first switching unit for outputting a signal having a frequency corresponding to one of a sum and a difference of a frequency of the RF+ signal and a frequency of a positive LO (LO+) signal by performing a switching operation according to the LO+ signal, and a second switching unit for outputting a signal having a frequency corresponding to one of a sum and a difference of a frequency of the RF− signal and a frequency of a negative LO (LO−) signal by performing a switching operation according to the LO− signal.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Exemplary embodiments of the present invention provide a frequency mixing apparatus with improved voltage gain and linearity.

Figure 2:
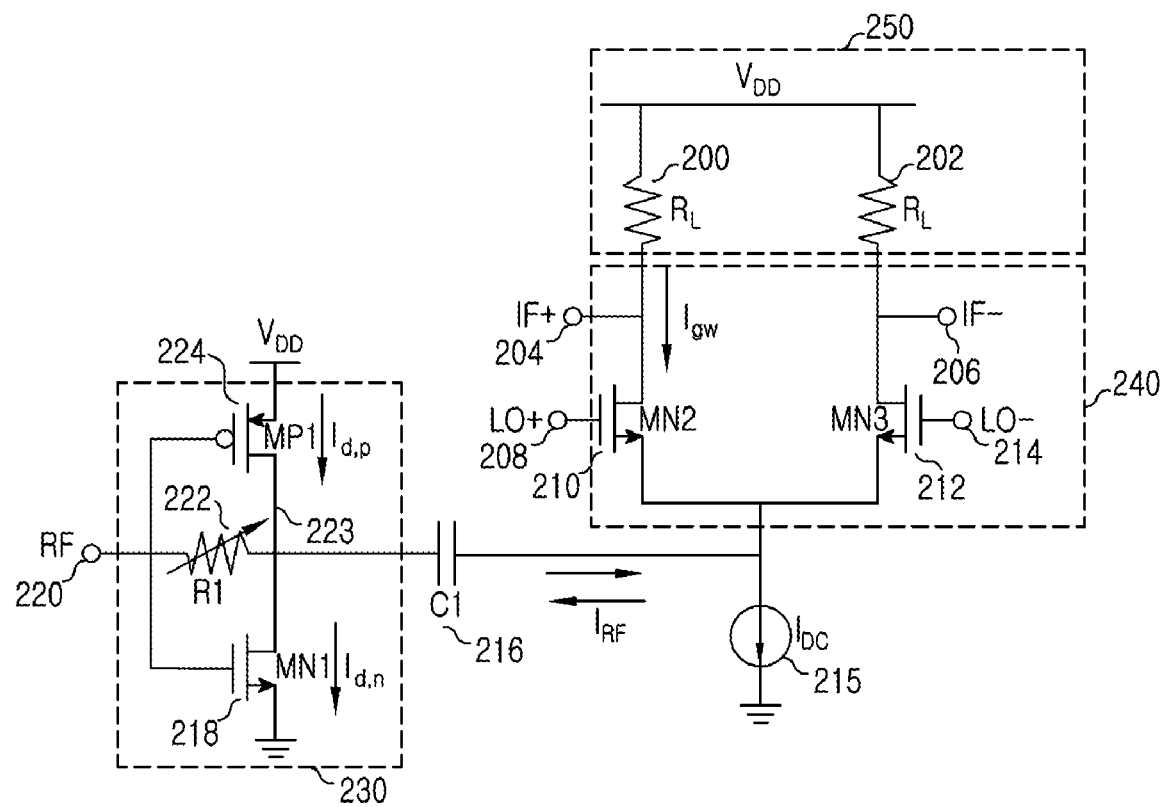
FIG. 2 illustrates a circuit diagram of a single-balanced frequency mixer according to an exemplary embodiment of the present invention.

FIG. 2 illustrates a circuit diagram of a single-balanced frequency mixer according to an exemplary embodiment of the present invention.

Referring to FIG. 2, the frequency mixer has a structure that includes a transconductor unit 230 and a switching unit 240 that are coupled to each other via a capacitor C1 216. An output unit 250 including resistors $R_L$ 200 and 202 is coupled to the switching unit 240. Alternatively, output unit 250, including resistors $R_L$ 200 and 202, may be part of switching unit 240.

The transconductor 230 includes an N-type Metal Oxide Semiconductor (MOS) MN1 218 and a P-type MOS MP1 224. The gates of transistors MN1 218 and MP1 224 are coupled together via a common gate node 220 and receive an RF signal via the common gate node 220. The drains of transistors MN1 218 and MP1 224 are coupled together via a common drain node 223, and transfer an RF current $I_{RF}$ to the switching unit 240 via the capacitor C1 216 connected to the common drain node 223. The RF current $I_{RF}$ flows from the switching unit 240 to the transconductor unit 230 while the phase of an RF signal is positive (+), and flows from the transconductor unit 230 to the switching unit 240 while the phase of an RF signal is negative (−).

A variable resistor R1 222 may be used to allow DC voltages of the common gate node 220 and the common drain node 223 of the transistors MN1 218 and MP1 224 to be equalized to each other, and may control a voltage gain by feeding back an AC signal. In one implementation, a fixed resistor may be used instead of the variable resistor R1 222. However, when the fixed resistor is used, a voltage gain is fixed as a constant.

Figure 1:
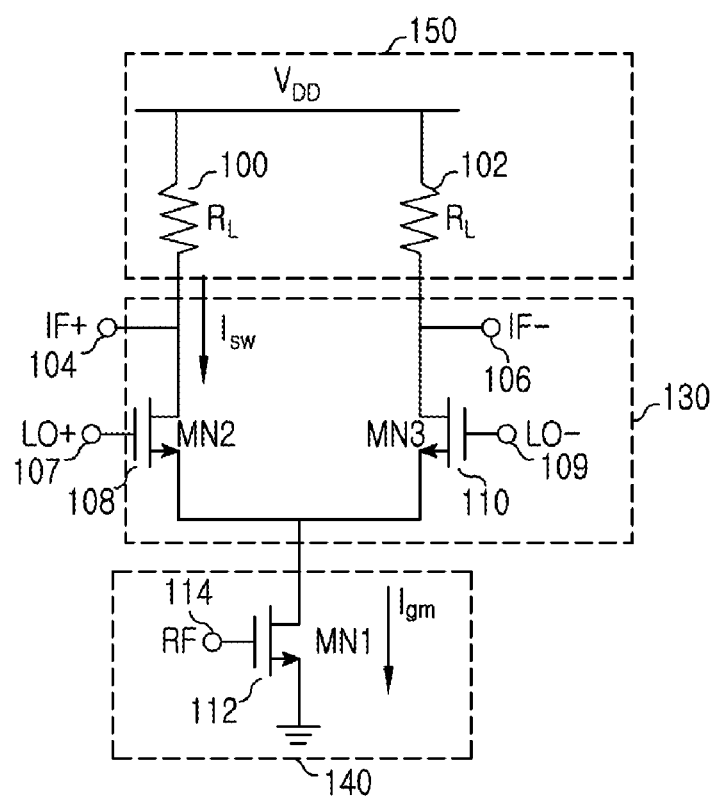
FIG. 1 illustrates a circuit diagram of a conventional single-balanced frequency mixer.

The switching unit 240 has substantially the same construction as that of the switching unit 130 of the conventional single-balanced frequency mixer discussed above with reference to FIG. 1. A bias is applied to the switching unit 240 by connecting a current source $I_{DC}$ 215 to a common source node of transistors MN2 210 and MN3 212.

In contrast, a bias may be applied to the transconductor 230 by self-biasing without a separate bias circuit. For example, since the magnitudes of DC currents flowing through transistors MN1 218 and MP1 224 are substantially the same and a DC current substantially does not flow through the common gate node 220 of the transistors MN1 218 and MP1 224, substantially the same voltage is applied to the common gate node 220 and the common drain node 223 that are coupled via the variable resistor R1 222. Therefore, the bias of each transistor may be controlled by controlling only a ratio of sizes (widths of the transistors) of the P-type MOS MP1 224 and the N-type MOS MN1 218. Generally, since linearity of a transistor improves as a gate-source voltage $V_{gs}$ and a drain-source voltage $V_{ds}$ are increased, the size of each transistor is controlled such that $V_{gs}=V_{ds}=\frac{1}{2}V_{DD}$.

Assuming that a voltage of an RF signal received at an input unit of the transconductor 230 is $V_{in}$, a current $i_{d,n}$ and a current $i_{d,p}$ flowing through the transistors MN1 218 and MP1 224, respectively, and a current $I_{RF}$ flowing through the switching unit 240 can be expressed using Equation (1).

$$i_{d,n} = g_{mn}v_{in} + g_{mn2}v_{in}^2 + g_{mn3}v_{in}^3 + \ldots \quad (1)$$
$$i_{d,p} = g_{mp}(-v_{in}) + g_{mp2}(-v_{in})^2 + g_{mp3}(-v_{in})^3 + \ldots$$
$$I_{RF} = i_{d,n} - i_{d,p}$$
$$= (g_{mn} + g_{mp})v_{in} + (g_{mn2} - g_{mp2})v_{in}^2 + (g_{mn3} + g_{mp3})v_{in}^3 + \ldots$$

where $g_{mn}$ is transconductance of N-type MOS 218, $g_{mp}$ is transconductance of P-type MOS MP1 224, $i_{d,n}$ is a current obtained by summing all of a current $g_{mn2}v_{in}^2$ by a second harmonic component, a current $g_{mn3}v_{in}^3$ by a third harmonic component, . . . , and a current by an n-th harmonic component, and $i_{d,p}$ is a current obtained by summing all of a current $g_{mp2}v_{in}^2$ by a second harmonic component, a current $g_{mp3}v_{in}^3$ by a third harmonic component, . . . , and a current by an n-th harmonic component.

An RF current signal $I_{RF}$ coming from the transconductor 230 via the capacitor C1 216 is applied to the common source node of the transistors MN2 210 and MN3 212 of the switching unit 240. Since impedance of a source side of the transistors MN2 210 and MN3 212 is lower than impedance of the current source $I_{DC}$ 215, most of the RF current $I_{RF}$ is input to the transistors MN2 210 and MN3 212 of the switching unit 240.

In operation, when an RF signal is input to common gate node 220 of the transconductor 230, the transconductor 230 converts the RF signal into a current signal $I_{RF}$, and the converted current signal is applied to the switching unit 240. While LO signals LO+ and LO− are input via gates 107 and 109, transistors MN2 210 and MN3 212 are switched on/off by the current signal $I_{RF}$ applied to the switching unit 240, so that a signal corresponding to a difference (Intermediate Frequency (IF)) between an RF frequency and an LO frequency is output via drain nodes 204 and 206.

A single-balanced frequency mixer, such as the single-balanced frequency mixer described above with reference to FIG. 2, may be used to design a double-balanced frequency mixer, such as the double-balanced frequency mixer described below with reference to FIG. 3.

Figure 3:
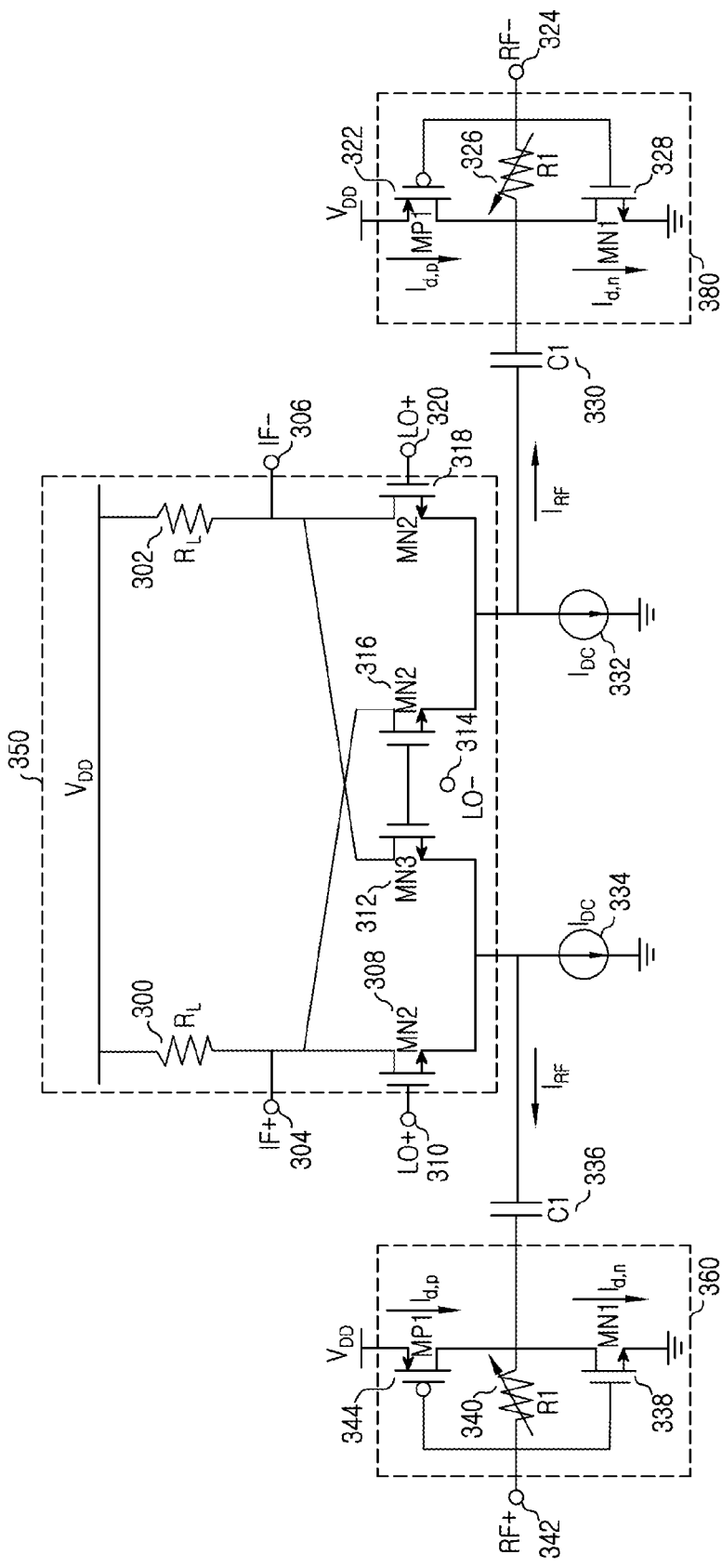
FIG. 3 illustrates a circuit diagram of a double-balanced frequency mixer according to an exemplary embodiment of the present invention.

FIG. 3 is a circuit diagram of a double-balanced frequency mixer according to an exemplary embodiment of the present invention.

Referring to FIG. 3, the double-balanced frequency mixer includes a first transconductor 360, a second transconductor 380, and a switching unit 350.

The first transconductor unit 360 and the switching unit 350 are coupled to each other via a capacitor C1 336. The second transconductor unit 380 and the switching unit 350 are coupled to each other via a capacitor C1 330. In other words, the capacitor C1 336 substantially blocks a DC current $I_{DC}$ from a current source 334 and substantially passes only an AC current $I_{RF}$. The capacitor C1 (330) substantially blocks a DC current $I_{DC}$ from a current source 332 and substantially passes only an AC current $I_{RF}$.

The first transconductor 360 includes an N-type MOS MN1 338 and a P-type MOS MP1 344. The two transistors share a common gate node 342 and receive an RF+ signal via the common gate node 342. The two transistors share a common drain node. An RF current $I_{RF}$ is introduced from the switching unit 350 via the capacitor C1 336 connected to the common drain node of MN1 338 and MP1 344. A variable resistor R1 340 may apply a bias to the first transconductor 360, and may vary its resistance, thereby controlling a voltage gain.

Likewise, the second transconductor 380 includes an N-type MOS MN1 328 and a P-type MOS MP1 322. The two transistors share a common gate node 324 and receive an RF− signal via the common gate node 324. The two transistors share a common drain node. An RF current $I_{RF}$ is introduced from the switching unit 350 via the capacitor C1 330 connected to the common drain node. A variable resistor R1 326 may apply a bias to the second transconductor 380, and may varies its resistance, thereby controlling a voltage gain.

The switching unit 350 is divided into a first switching unit and a second switching unit. The first switching unit includes resistors $R_L$ 300 and 302, and transistors MN2 308 and MN3 312. The second switching unit includes the resistors $R_L$ 300 and 302, and transistors MN2 316 and MN3 318. While resistors $R_L$ 300 and 302 are described as part of switching unit 350, resistors $R_L$ 300 and 302 may instead be part of an output unit that is coupled to switching unit 350.

When the first transconductor 360 converts the RF+ signal into an RF current, the first switching unit outputs the frequency of the RF current as an Intermediate Frequency (IF). That is, an LO+ signal input via gate node 310 and an LO− signal input via common gate node 314) switches on/off transistors MN2 308 and MN3 312, so that a difference between the RF frequency and an LO frequency is output.

Similarly, when the second transconductor 380 converts the RF− signal into an RF current, the second switching unit outputs the frequency of the RF current as an IF. That is, an LO+ signal input via gate node 320 and an LO− signal input via common gate node 314 switches on/off transistors MN2 316 and MN3 318, so that a difference between the RF frequency and an LO frequency is output. An IF+ signal is output via common drain node 304 and an IF− signal is output via common drain node 306.

The current source $I_{DC}$ 334 is applied as a bias of the first switching unit, and the current source $I_{DC}$ 332 is applied as a bias of the second switching unit.

As described above, in the double-balanced frequency mixer according to an exemplary embodiment of the present invention, RF, LO, and IF signal ports are substantially separated from one another, thereby providing effective isolation there between. In addition, since harmonic components of even degrees are substantially cancelled by their phases, generation of various spurious or harmonic waves is suppressed.

As described above, since a bias of the transconductor and a bias of the switching unit of the frequency mixers proposed according to exemplary embodiments of the present invention are substantially independent and substantially separate from each other, transconductance of the transconductor unit becomes $g_{mn}+g_{mp}$. Thereby, a voltage gain of about twice that of the conventional transconductance can be obtained. In addition, in the case where $g_{mn2}=g_{mp2}$, second degree harmonic components are substantially removed, so that linearity may improve.

Figure 4:
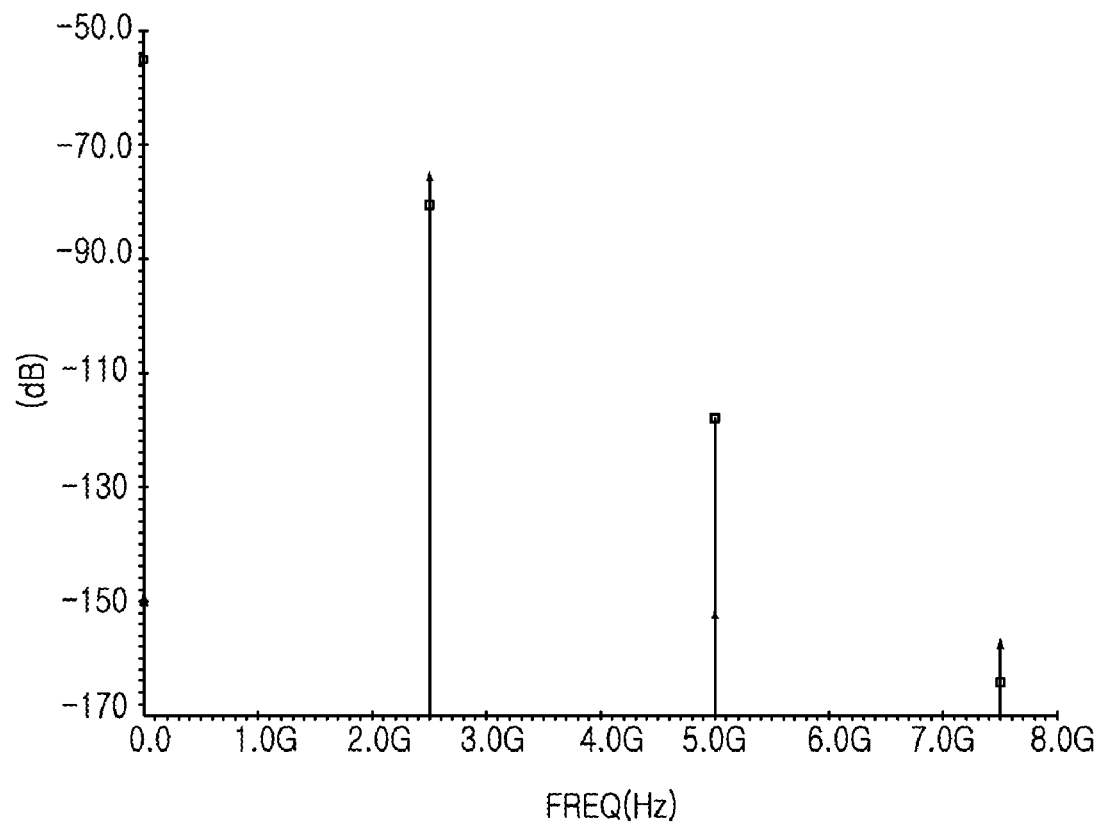
FIG. 4 illustrates a graph comparing output current $I_{RF}$ spectrums of a conventional frequency mixer and a frequency mixer according to an exemplary embodiment of the present invention.

FIG. 4 illustrates a graph comparing output current $I_{RF}$ spectrums of a conventional frequency mixer and a frequency mixer according to an exemplary embodiment of the present invention. In FIG. 4, it is revealed that a basic frequency signal has been increased by about 6 dB, and a second degree harmonic component has been reduced by about 35 dB.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. A low voltage frequency mixing apparatus with improved voltage gain and linearity, the apparatus comprising:

a transconductor whose voltage gain is controllable, for converting a Radio Frequency (RF) signal into a current signal under control of a first bias that is self bias;

a separator for transferring the current signal to a switching unit; and the switching unit for receiving a second bias and for outputting a signal having a frequency corresponding to a difference of a frequency of the RF signal and a frequency of a Local Oscillation (LO) signal by performing a switching operation according to the LO signal wherein the transconductor comprises:

a first Metal Oxide Semiconductor (MOS) transistor;
a second MOS transistor; and
a resistor connected to a drain of the first MOS transistor and a gate of the second MOS transistor,
wherein the drain of the first MOS transistor is coupled to a drain of the second MOS transistor, and a gate of the first MOS transistor and the gate of the second MOS transistor receive the RF signal, and
wherein the resistor couples drains and gates of the first MOS transistor and the second MOS transistor.

2. The apparatus of claim 1, wherein the first MOS transistor comprises a P-type MOS transistor and the second MOS transistor comprises an N-type MOS transistor.

3. The apparatus of claim 1, wherein the resistor comprises a variable resistor, sets a voltage gain, and supplies the first bias to the first MOS transistor and the second MOS transistor.

4. The apparatus of claim 1, wherein the separator separates the first bias and the second bias supplied to the transconductor and the switching unit, respectively, by a capacitor.

5. The apparatus of claim 4, wherein the second bias supplied to the switching unit is generated using a current source.

6. The apparatus of claim 1, wherein the switching unit comprises:
   a third MOS transistor;
   a fourth MOS transistor;
   a first resistor; and
   a second resistor,
   wherein the second bias is applied to the third MOS transistor and the fourth MOS transistor by supplying a current source to sources of the third MOS transistor and the fourth MOS transistor, and drains of the third MOS transistor and the fourth MOS transistor are coupled to the first resistor and the second resistor, respectively.

7. The apparatus of claim 6, wherein on/off switching operations are performed by supplying positive LO (LO+) and negative LO (LO−) signals to gates of the third MOS transistor and the fourth MOS transistor, respectively.

8. The apparatus of claim 1, wherein the first MOS transistor transconductance is the same as a transconductance of the second MOS transistor.

9. The apparatus of claim 1, wherein the first and second MOS transistors gate-source voltage ($V_{gs}$) and drain-source voltage ($V_{ds}$) are ½ drain voltage ($V_{DD}$).

10. A low voltage frequency mixing apparatus with improved voltage gain and linearity, the apparatus comprising:
   a first transconductor for converting a positive Radio Frequency (RF+) signal into a first current signal under control of a first self bias, and a second transconductor for converting a negative RF (RF−) signal into a second current signal under control of a second self bias;
   a first separator for transferring the first current signal to a switching unit, and a second separator for transferring the second current signal to the switching unit; and
   a first switching unit for receiving a third bias and for outputting a signal having a frequency corresponding to a difference of a frequency of the RF+ signal and a frequency of a positive Local Oscillation (LO+) signal by performing a switching operation according to the LO+ signal, and a second switching unit for receiving a fourth bias and for outputting a signal having a frequency corresponding to one of a sum and a difference of a frequency of the RF-signal and a frequency of a negative LO (LO−) signal by performing a switching operation according to the LO− signal
   wherein each of the first transconductor and the second transconductor comprises:
      a first Metal Oxide Semiconductor (MOS) transistor;
      a second MOS transistor; and
      a resistor connected to a drain of the first MOS transistor and a gate of the second MOS transistor,
      wherein the drain of the first MOS transistor is coupled with a drain of the second MOS transistor, and a gate of the first MOS transistor and the gate of the second MOS transistor receive the RF signal, and
      wherein the resistor couples drains and gates of the first MOS transistor and the second MOS transistor.

11. The apparatus of claim 10, wherein the first MOS transistor comprises a P-type MOS transistor and the second MOS transistor comprises an N-type MOS transistor.

12. The apparatus of claim 10, wherein the resistor comprises a variable resistor, sets a voltage gain, and supplies the first self bias and the second self bias to the first MOS transistor and the second MOS transistor, respectively.

13. The apparatus of claim 10, wherein the first separator separates the first self bias supplied to the first transconductor and the third bias supplied to the first switching unit, and the second separator separates the second self bias supplied to the second transconductor and the fourth bias supplied to the second switching unit, respectively, by capacitors.

14. The apparatus of claim 13, wherein the third bias and the fourth bias supplied to the first switching unit and the second switching unit, respectively, are generated using respective current sources.

15. The apparatus of claim 10, wherein
   the first switching unit comprises:
      a third MOS transistor,
      a fourth MOS transistor,
      a first resistor, and
      a second resistor; and
   the second switching unit comprises:
      a fifth MOS transistor, and
      a sixth MOS transistor,
   wherein the third bias is applied to the third MOS transistor and the fourth MOS transistor by supplying a first current source to sources of the third MOS transistor and the fourth MOS transistor, and drains of the third MOS transistor and the fourth MOS transistor are coupled to the first resistor and the second resistor, respectively,
   wherein the fourth bias is applied to the fifth MOS transistor and the sixth MOS transistor by supplying a second current source to sources of the fifth MOS transistor and the sixth MOS transistor, and drains of the fifth MOS transistor and the sixth MOS transistor are coupled to the first resistor and the second resistor, respectively,
   wherein a drain of the third MOS transistor is coupled with a drain of the fifth MOS transistor, and a drain of the fourth MOS transistor is coupled with a drain of the sixth MOS transistor.

16. The apparatus of claim 10, wherein the first MOS transistor a transconductance is the same as a transconductance of the second MOS transistor.

17. The apparatus of claim 10, wherein the first and second MOS transistors gate-source voltage ($V_{gs}$) and a drain-source voltage ($V_{ds}$) are ½ drain voltage ($V_{DD}$).

* * * * *